United States Patent
Lee

(10) Patent No.: US 7,457,188 B2
(45) Date of Patent: Nov. 25, 2008

(54) SEMICONDUCTOR MEMORY DEVICE HAVING CONNECTED BIT LINES AND DATA SHIFT METHOD THEREOF

(75) Inventor: Dong-Hyuk Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/457,050

(22) Filed: Jul. 12, 2006

(65) Prior Publication Data

US 2007/0014181 A1 Jan. 18, 2007

(30) Foreign Application Priority Data

Jul. 15, 2005 (KR) ...................... 10-2005-0064064

(51) Int. Cl.
*G11C 8/00* (2006.01)
(52) U.S. Cl. ............................. 365/230.05; 365/189.01; 365/221
(58) Field of Classification Search ............ 365/230.03, 365/230.05, 221, 189.01, 189.12, 205, 149
See application file for complete search history.

(56) References Cited

U.S. PATENT DOCUMENTS

| | | |
|---|---|---|
| 5,600,601 A | 2/1997 | Murakami et al. |
| 5,777,927 A * | 7/1998 | Takahashi et al. ...... 365/189.01 |
| 5,835,436 A | 11/1998 | Ooishi |
| 6,339,817 B1 * | 1/2002 | Maesako et al. ............ 711/165 |
| 6,510,098 B1 * | 1/2003 | Taylor .................... 365/230.05 |
| 7,009,899 B2 * | 3/2006 | Lee ............................ 365/203 |

FOREIGN PATENT DOCUMENTS

| | | |
|---|---|---|
| JP | 2003-123477 | 4/2003 |
| KR | 1999-0064902 | 8/1999 |

OTHER PUBLICATIONS

English language abstract of Korean Publication No. 1999-0064902.
English language abstract of Japanese Publication No. 2003-123477.

* cited by examiner

*Primary Examiner*—Zandra Smith
*Assistant Examiner*—Paul E Patton
(74) *Attorney, Agent, or Firm*—Marger Johnson & McCollom, P.C.

(57) ABSTRACT

Provided is a semiconductor memory device having connected bit lines and a data shifting method thereof. An embodiment of the semiconductor memory device includes a plurality of memory cell blocks each including a plurality of bit lines and a plurality of word lines, a plurality of sense amplifier blocks respectively disposed between the memory cell blocks, wherein each sense amplifier block includes a plurality of sense amplifier circuits corresponding to the bit lines, and a plurality of switches. The switches connect bit lines not sharing a sense amplifier block among bit lines of adjacent memory cell blocks between which the sense amplifier block is disposed, in response to a shift signal. Therefore, in the semiconductor memory device and the data shift method thereof, it is possible to easily shift data stored in memory cells connected to an arbitrary word line to memory cells connected to another arbitrary word line.

10 Claims, 6 Drawing Sheets

SEMICONDUCTOR MEMORY DEVICE HAVING CONNECTED BIT LINES AND DATA SHIFT METHOD THEREOF

CROSS-REFERENCE TO RELATED PATENT APPLICATIONS

This application claims the benefit of Korean Patent Application No. 10-2005-0064064, filed on Jul. 15, 2005, in the Korean Intellectual Property Office, the disclosure of which is incorporated by reference.

BACKGROUND

1. Field of the Invention

The present invention relates to a semiconductor memory device, and more particularly, to a semiconductor memory device which is capable of shifting data by connecting bit lines, and a method of shifting data thereof.

2. Description of the Related Art

The capacity of data needed to perform functions is increasing. Data with high correlation among a large amount of data is stored at adjacent addresses in a semiconductor memory device.

In this case, if data at an arbitrary row address can be shifted to a different address, various advantages can be obtained.

FIG. 1 is a view for explaining a conventional operation of shifting data at an arbitrary row address to a different row address.

Referring to FIG. 1, data stored in memory cells connected to a word line WL1 is shifted to memory cells connected to a word line WL2. Such data shifting is useful in shifting the location of a large amount of data in graphic memories, etc. Also, data shifting can be used to selectively refresh only regions in which desired data is stored after the data is stored at adjacent addresses of a memory device.

In addition, if data at an arbitrary row address can be shifted to a different row address, various advantages can be obtained in view of the operation of a memory device.

FIG. 2A is a view illustrating memory cell blocks and sense amplifier blocks of a conventional semiconductor memory device.

FIG. 2A illustrates memory cell blocks MCB1 and MCB2 disposed between the sense amplifier blocks SAB1, SAB2, and SAB3. Each of the sense amplifier blocks SAB1, SAB2, and SAB3 includes a plurality of sense amplifier circuits (not shown).

Bit lines BL of the memory cell block MCB1 are connected to sense amplifier circuits (not shown) of the sense amplifier block SAB2. Inverted bit lines /BL of the memory cell block MCB1 are connected to sense amplifier circuits (not shown) of the sense amplifier block SAB1.

Bit lines BL of the memory cell block MCB2 are connected to sense amplifier circuits (not shown) of the sense amplifier block SAB3. Inverted bit lines /BL of the memory cell block MCB2 are connected to sense amplifier circuits (not shown) of the sense amplifier block SAB2.

FIG. 2B is a schematic view for explaining a connection relationship between sense amplifier circuits included in the sense amplifier blocks and bit lines of FIG. 2A.

Hereinafter, the connection relationship between the bit lines BL, the inverted bit lines /BL, and the sense amplifier circuits SA1, SA2, SA3, and SA4 will be described in more detail with reference to FIG. 2B.

In FIG. 2B, it is assumed that a sense amplifier circuit SA1 is disposed in the sense amplifier block SAB1, a sense amplifier circuit SA2 is disposed in the sense amplifier block SAB2, a sense amplifier circuit SA3 is disposed in the sense amplifier block SAB3, and a sense amplifier circuit SA4 is disposed in another sense amplifier circuit (not shown).

A bit line and an inverted bit line of the same memory cell block are connected to different sense amplifier circuits respectively. That is, a bit line of a first memory cell block and an inverted bit line of a second memory cell block are connected to the same sense amplifier circuit.

Referring to FIG. 2B, a bit line BL and an inverted bit line /BL of the memory cell block MCB1 are connected to a sense amplifier circuit SA2 and a sense amplifier circuit SA1 respectively. That is, a bit line BL of the memory cell block MCB1 and an inverted bit line /BL of the memory cell block MCB2 are connected to the same sense amplifier circuit SA2.

Likewise, a bit line BL of the memory cell block MCB2 and an inverted bit line /BL of the memory cell block MCB3 are connected to the sense amplifier circuit SA3. The configuration described above is called an "open-type" sense amplifier circuit.

FIG. 3A is a view illustrating memory cell blocks and sense amplifier blocks of a conventional semiconductor memory device.

FIG. 3A illustrates memory cell blocks MCB1 and MCB2 disposed between sense amplifier blocks SAB1, SAB2, and SAB3. Each of the sense amplifier blocks SAB1, SAB2, and SAB3 includes a plurality of sense amplifier circuits (not shown).

Bit lines BL and inverted bit lines /BL of the memory cell block MCB1 are alternately connected in pairs to sense amplifier circuits (not shown) of the sense amplifier block SAB2 and to sense amplifier circuits (not shown) of the sense amplifier block SAB1. Also, bit lines BL and inverted bit lines /BL of the memory cell block MCB2 are alternately connected in pairs to sense amplifier circuits (not shown) of the sense amplifier block SAB2 and to sense amplifier circuits (not shown) of the sense amplifier block SAB3.

FIG. 3B is a schematic view for explaining a connection relationship between sense amplifier circuits included in the sense amplifier blocks and bit lines of FIG. 3A. Hereinafter, a connection relationship of the bit lines BL, the inverted bit lines /BL, and the sense amplifier circuit SA1 will be described in more detail with reference to FIG. 3B.

In FIG. 3B, it is assumed that a sense amplifier circuit SA1 is disposed in the sense amplifier block SAB2. A bit line BL and an inverted bit line /BL (bit line pair) of the same memory cell block are connected to the same sense amplifier circuit SA1. In more detail, a bit line BL and an inverted bit line /BL of the memory cell block MCB1 are connected to the sense amplifier circuit SA1. Also, a bit line BL and an inverted bit line /BL of the memory cell block MCB2 are connected to the sense amplifier circuit SA1.

When the bit line BL and inverted bit line /BL of the memory cell block MCB1 are connected to the sense amplifier circuit SA1, isolation transistors ITR1 and ITR2 are turned on in response to a control signal S1, and isolation transistors ITR3 and ITR4 are turned off in response to another control signal S2. Accordingly, when the sense amplifier circuit SA1 operates, the bit line pairs of the memory cell block MCB1 positioned on the one side of the sense amplifier circuit SA1 are connected to the sense amplifier circuits SA1 by the isolation transistors ITR1 and ITR2. And the bit line pairs of the memory cell block MCB2 positioned on the other side of the sense amplifier circuit SA1 are disconnected from the sense amplifier circuits SA11 by the isolation transistors ITR3 and ITR4.

The connection configuration described above is called a "folded-type" sense amplifier circuit.

Conventionally, as illustrated in FIGS. 2A and 3A, bit line pairs of memory cell blocks are isolated from bit line pairs of different memory cell blocks adjacent to the memory cell blocks. However, if bit line pairs of adjacent memory cell blocks are connected to each other, data at an arbitrary row address can be easily shifted to a different row address.

SUMMARY

The present invention provides a semiconductor memory device which is capable of easily shifting data of an arbitrary row address to a different row address.

The present invention also provides a data shifting method which is performed by a semiconductor memory device capable of easily shifting data of an arbitrary row address to a different row address.

According to one embodiment of the present invention, a semiconductor memory device includes a plurality of memory cell blocks, a plurality of sense amplifier blocks, and a plurality of switches. Here, the plurality of memory cell blocks each includes a plurality of bit lines and a plurality of word lines. The plurality of sense amplifiers blocks may be respectively disposed between the memory cell blocks, where each sense amplifier block includes a plurality of sense amplifier circuits corresponding to the bit lines. Also, the plurality of switches may connect bit lines not sharing a sense amplifier block among bit lines of adjacent memory cell blocks between which the sense amplifier block is disposed in response to a shift signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
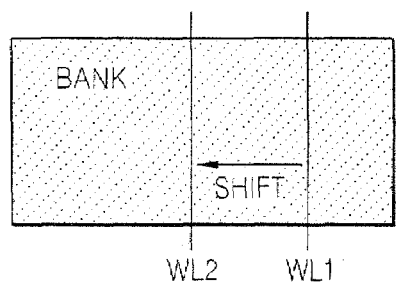
FIG. 1 is a view for explaining a conventional operation of shifting data of an arbitrary row address to a different row address.
Figure 2A:
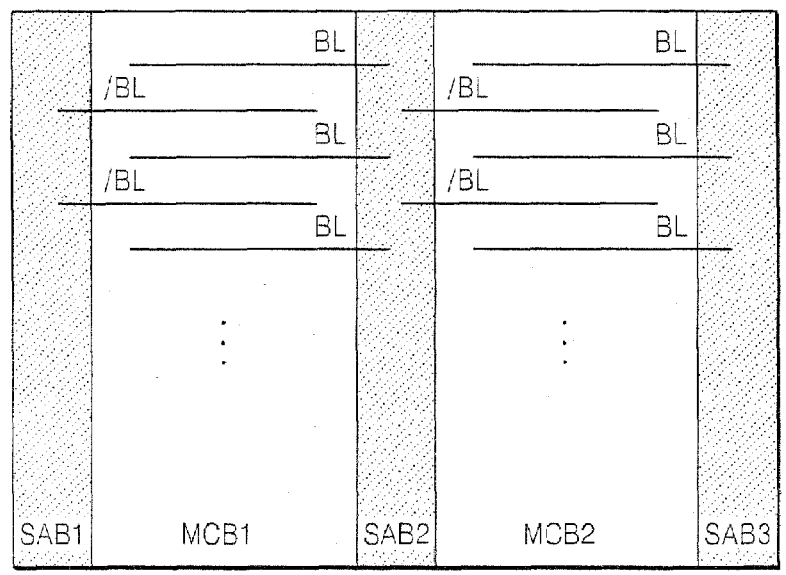
FIG. 2A is a view illustrating memory cell blocks and sense amplifier blocks of a conventional semiconductor memory device.
Figure 2B:
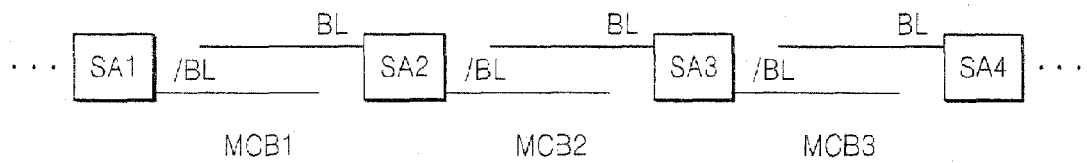
FIG. 2B is a schematic view for explaining a connection relationship between sense amplifier circuits included in the sense amplifier blocks and bit lines of FIG. 2A.
Figure 3A:
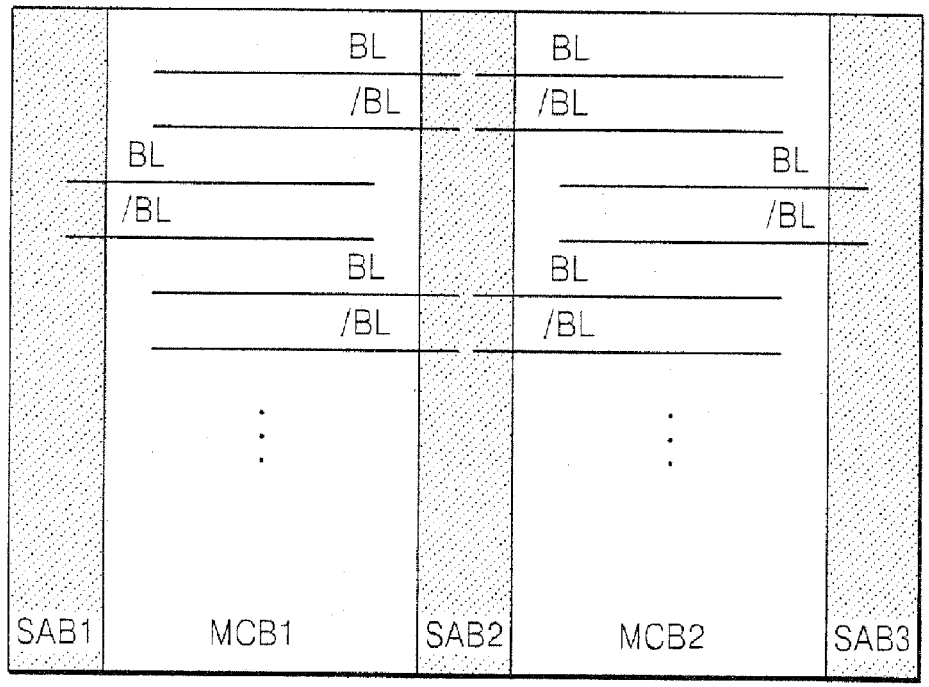
FIG. 3A is a view illustrating memory cell blocks and sense amplifier blocks of a conventional semiconductor memory device.
Figure 3B:
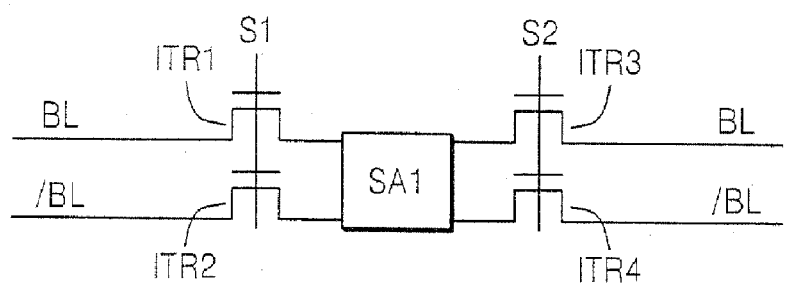
FIG. 3B is a schematic view for explaining a connection relationship between sense amplifier circuits included in the sense amplifier blocks and bit lines of FIG. 3A.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 4:
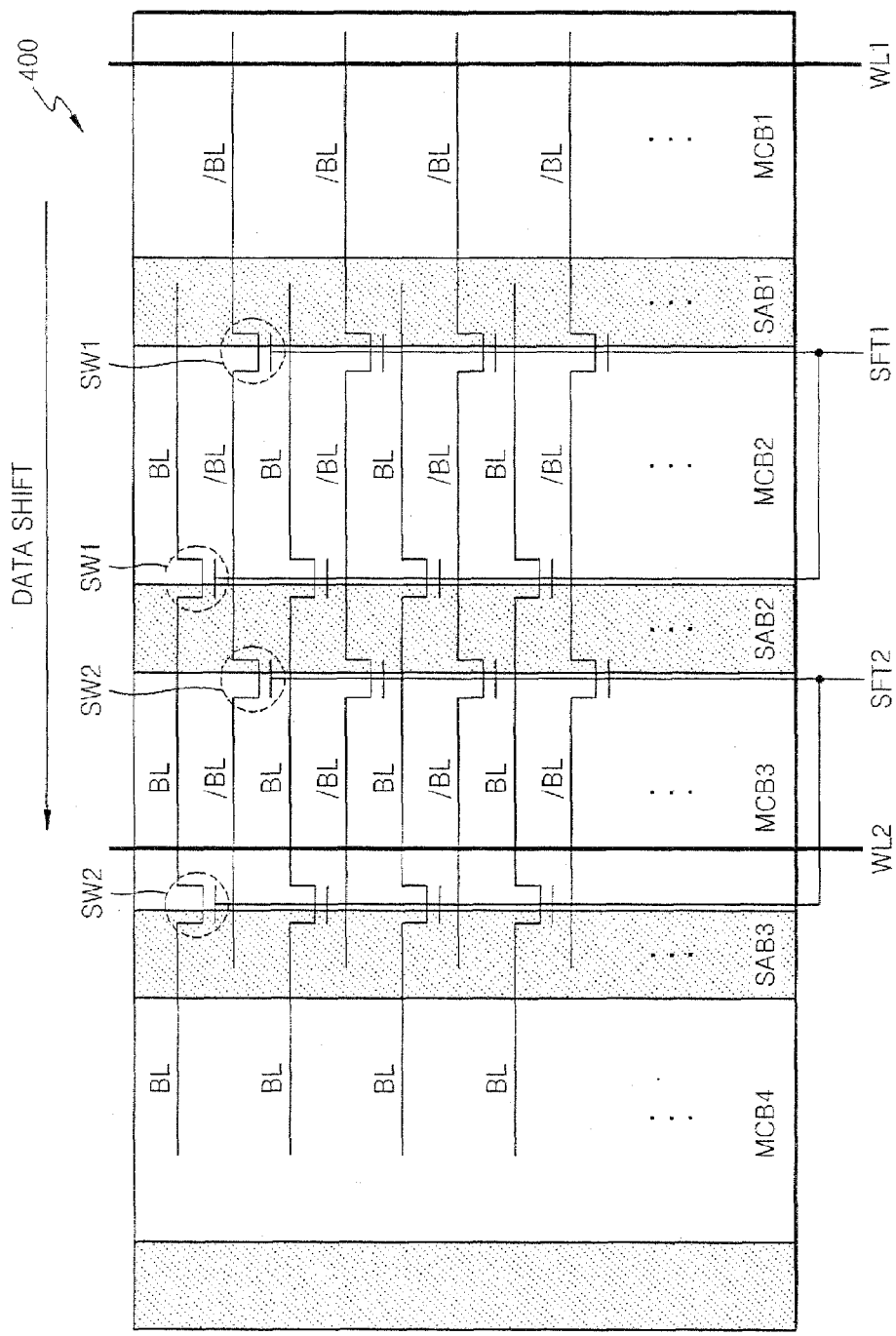
FIG. 4 is a view for explaining a semiconductor memory device according to an embodiment of the present invention.

FIG. 4 is a view for explaining a semiconductor memory device 400 according to an embodiment of the present invention.

Figure 5:
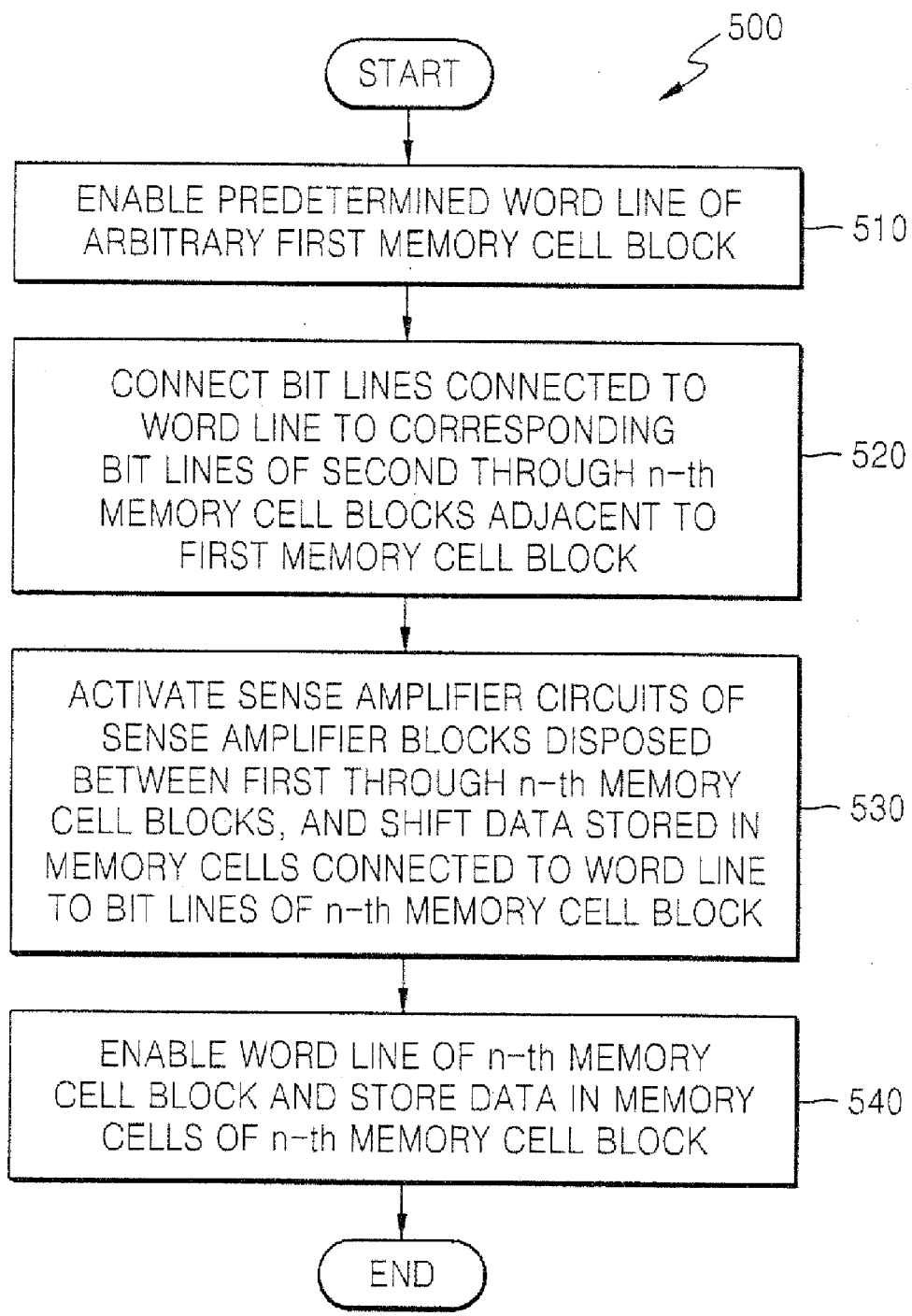
FIG. 5 is a flowchart illustrating a data shifting method which is performed by the semiconductor memory device illustrated in FIG. 4, according to an embodiment of the present invention.

FIG. 5 is a flowchart illustrating a data shifting method which is performed by the semiconductor memory device 400 illustrated in FIG. 4.

Referring to FIG. 4, the semiconductor device 400 includes a plurality of memory cell blocks MCB1, MCB2, MCB3, and MCB4 each including a plurality of bit lines BL and inverted bit lines /BL and a plurality of word lines WL, a plurality of sense amplifier blocks SAB1, SAB2, and SAB3, which are respectively disposed between the memory cell blocks MCB1, MCB2, MCB3, and MCB4, wherein each of the sense amplifier blocks SAB1, SAB2, and SAB3 includes a plurality of sense amplifier circuits (not shown) respectively corresponding to the bit lines BL, and a plurality of switches SW1 and SW2.

The switches SW1 and SW2 connect bit lines not sharing a sense amplifier block among bit lines of adjacent memory cell blocks between which the sense amplifier block is disposed, in response to shift signals SFT1 and SFT2.

In the current embodiment of the present invention, each sense amplifier circuit (not shown) included in the sense amplifier blocks SAB1, SAB2, and SAB3 is an open-type sense amplifier circuit to which a bit line BL of a first memory cell block and an inverted bit line /BL of a second memory cell block adjacent to the first memory cell block are connected. That is, a bit line and an inverted bit line of the same memory cell block are connected to different sense amplifier circuits, respectively.

For example, a bit line BL of the memory cell block MCB2 and an inverted bit line /BL of the memory cell block MCB1 are connected to a sense amplifier circuit (not shown) of the sense amplifier block SAB1. That is, a bit line BL and an inverted bit line /BL of the memory cell block MCB2 are connected to the sense amplifier block SAB1 and the sense amplifier block SAB2 respectively.

In the adjacent memory cell blocks MCB1 and MCB2, the bit lines BL of the memory cell block MCB1 are isolated from the bit lines BL of the memory cell block MCB2. Also, the inverted bit lines /BL of the memory cell block MCB1 are isolated from the inverted bit lines /BL, of the memory cell block MCB2.

Likewise, in the adjacent memory cell blocks MCB2 and MCB3, the bit lines BL of the memory cell block MCB2 are isolated from the bit lines BL of the memory cell block MCB3. Also, the inverted bit lines /BL of the memory cell block MCB2 are isolated from the inverted bit lines /BL of the memory cell block MCB3.

In the semiconductor memory device 400 illustrated in FIG. 4, the isolated bit lines BL are connected to each other and the isolated inverted bit lines /BL are connected to each other, using the switches SW1 and SW2.

In detail, the switches SW1 connect the inverted bit lines /BL of the memory cell block MCB1 connected to the sense amplifier block SAB1, to the inverted bit lines /BL of the memory cell block MCB2 not connected to the sense amplifier block SAB1.

Also, the switches SWI connect the bit lines BL of the memory cell block MCB3 connected to the sense amplifier block SAB2, to the bit lines BL of the memory cell block MCB2 not connected to the sense amplifier block SAB2.

The switches SW2 connect the inverted bit lines /BL of the memory cell block MCB2 connected to the sense amplifier block SAB2, to the inverted bit lines /BL of the memory cell block MCB3 not connected to the sense amplifier block SAB2.

Also, the switches SW2 connect the bit lines BL of the memory cell block MCB3 connected to the sense amplifier block SAB3, to the bit lines BL of the memory cell block MCB4 not connected to the sense amplifier block SAB3.

In this manner, the switches SW1 and SW2 connect isolated bit lines BL to each other and also connect isolated inverted bit lines BL to each other, between adjacent memory cell blocks.

The switches SW1 and SW2 may be NMOS transistors or PMOS transistors whose gates receive shift signals SFT1 and SFT2. In FIG. 4, the switches SW1 and SW2 are NMOS transistors.

Alternately, the switches SW1 and SW2 may be transmission gates which are turned on or off in response to the shift signals SFT1 and SFT2. The shift signals SFT1 and SFT2 are activated so as to shift data of an arbitrary word line WL1 to memory cells connected to another arbitrary word line WL2. The shift signals SFT1 and SFT2 can be generated by a Mode Register Set (MRS).

Hereinafter, the semiconductor memory device 400 and a data shifting method 500 thereof will be described in detail with reference to FIGS. 4 and 5.

Referring to FIGS. 4 and 5, a predetermined word line WL1 of an arbitrary first memory cell block MCB1 is enabled (operation 510). Data stored in memory cells (not shown) connected to the word line WL1 is data to be shifted. Then, bit lines connected to the word line WL1 are connected to the corresponding bit lines of second through n-th memory cell blocks adjacent to the first memory cell block MCB1 (operation 520). Here, n represents a target memory cell block to which data connected to the word line WL1 will be shifted. In FIG. 4, n is 3 because data connected to the word line WL1 is shifted to the third memory block MCB3. However, it will be appreciated by one of ordinary skill in the art that the invention is not limited to the case where n is 3.

The bit lines are connected to each other by the switches SW1 and SW2 which are turned on or off in response to the shift signals SFT1 and SFT2. In order to shift data connected to the word line WL1 of the first memory cell block MCB1 to the word line WL2 of the third memory cell block MCB3, the switches SW1 and SW2 disposed between the first memory cell block MCB1 and the third memory cell block MCB3 are turned on.

Then, the sense amplifier circuits (not shown) of the sense amplifier blocks SAB1 and SAB2 respectively disposed between the first and second memory cell blocks MCB1 and MCB2 and between the second and third memory cell blocks MCB2 and MCB3 are activated so that data of memory cells connected to the word line WL1 is shifted to the bit lines of the third memory cell block MCB3 (operation 530).

If the sense amplifier circuits (not shown) of the sense amplifier block SAB1 are activated, data is shifted to the sense amplifier circuits of the sense amplifier block SAB1 via bit lines BL and inverted bit lines /BL. Then, sequentially, the sense amplifier circuits of the adjacent sense amplifier block SAB2 are activated.

In FIG. 4, data connected to the word line WL1 is shifted to the sense amplifier circuits of the sense amplifier block SAB1 via inverted bit lines /BL connected to the word line WL1. Also, since the switches SW1 connected to the sense amplifier block SAB1 are turned on, data in the sense amplifier block SAB1 is shifted to the sense amplifier block SAB2 via inverted bit lines /BL of the second memory cell block MCB2 connected to the switches SW1.

Since the switches SW2 connected to the sense amplifier block SAB2 are turned on, data in the sense amplifier block SAB2 is shifted to inverted bit lines /BL of the third memory cell block MCB3 connected to the switches SW2.

Then, the word line WL2 of the third memory cell block MCB3 is enabled, thereby storing the shifted data in memory cells connected to the word line WL2 of the third memory cell block MCB3 (operation 540). That is, when the word line WL2 is enabled, the data shifted to the inverted bit lines /BL of the third memory cell block MCB3 is stored in the memory cells connected to the word line WL2.

The semiconductor memory device 400 including the open-type sense amplifier circuits as illustrated in FIG. 4 can easily shift data stored in memory cells connected to an arbitrary word line WL1 to memory cells connected to a desired word line WL2 using the data shift method described above. In the current embodiment of the present invention, the memory cell blocks MCB1 through MCB4 illustrated in FIG. 4 may be disposed in the same memory bank.

Figure 6:
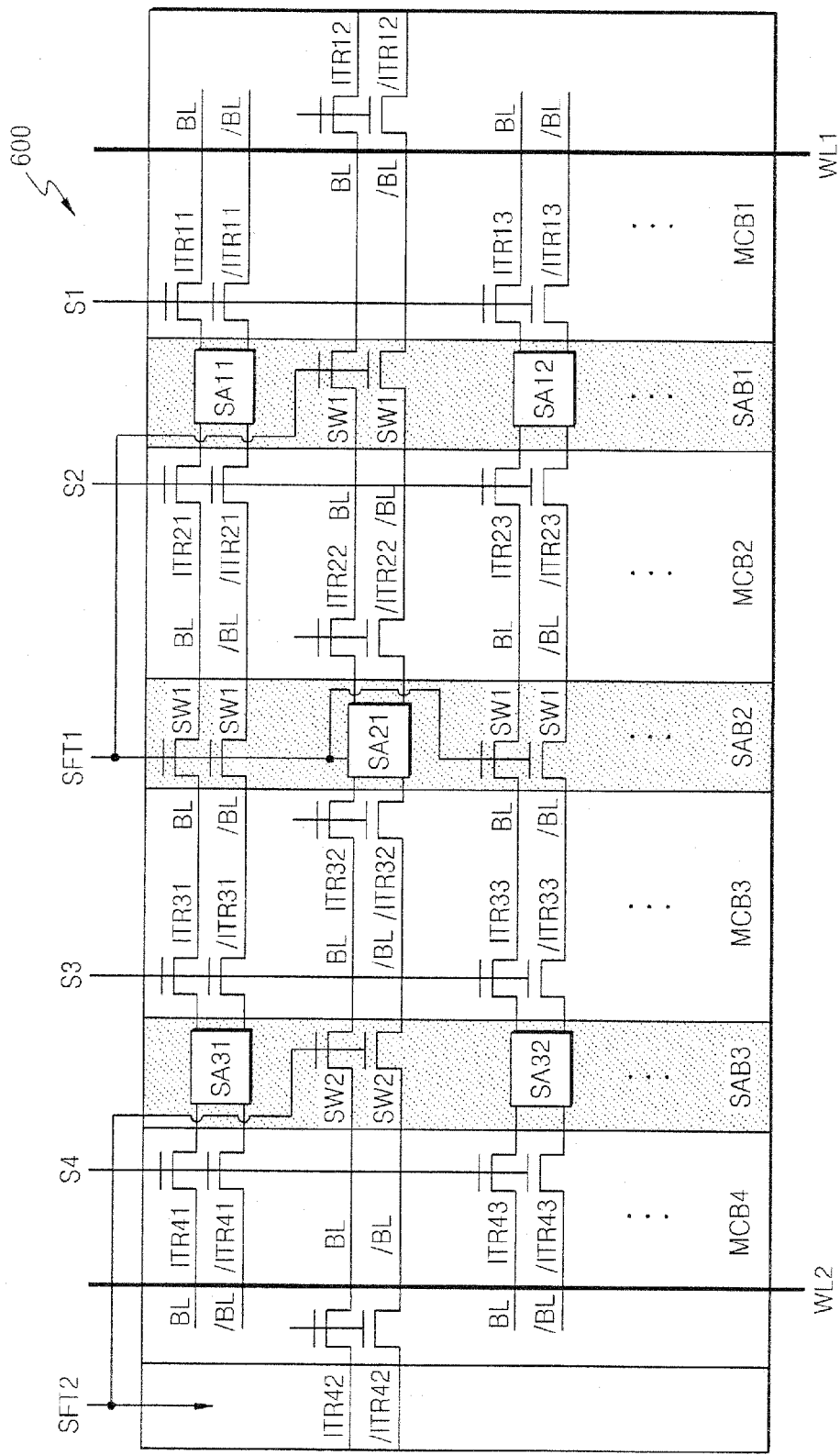
FIG. 6 is a view for explaining a semiconductor memory device according to another embodiment of the present invention.

FIG. 6 is a view for explaining a semiconductor memory device 600 according to another embodiment of the present invention.

Figure 7:
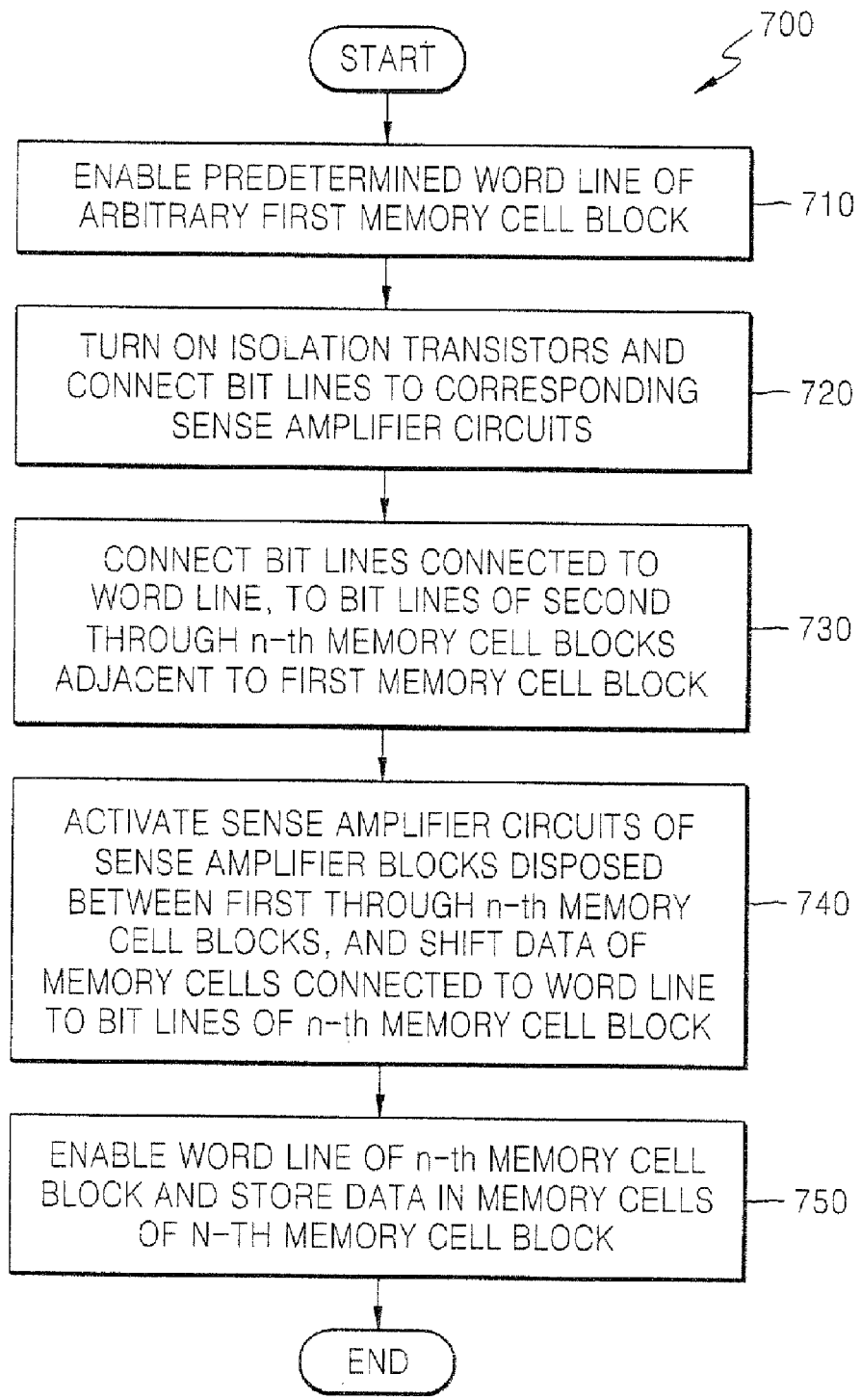
FIG. 7 is a flowchart illustrating a data shifting method which is performed by the semiconductor memory device illustrated in FIG. 6, according to an embodiment of the present invention.

FIG. 7 is a flowchart illustrating a data shifting method which is performed by the semiconductor memory device 600 illustrated in FIG. 6.

Referring to FIG. 6, the semiconductor memory device 600 includes a plurality of memory cell blocks MCB1, MCB2, MCB3, and MCB4 each including a plurality of bit lines BL and inverted bit lines /BL and a plurality of word lines WL, a plurality of sense amplifier blocks SAB1, SAB2, and SAB3 which are respectively disposed between the memory cell blocks MCB1, MCB2, MCB3, and MCB4, wherein each of the sense amplifier blocks SAB1, SAB2, and SAB3 includes sense amplifier circuits (not shown) corresponding to the bit lines BL, switches SW1 and SW2, and isolation transistors ITR11 and /ITR11, ITR2 and /ITR12, . . . , ITR43 and /ITR43.

The switches SW1 and SW2 connect bit lines not sharing a sense amplifier block among bit lines of adjacent memory cell blocks between which the sense amplifier block is disposed in response to shift signals SFT1 and SFT2. The bit lines not sharing a sense amplifier block may indicate the bit lines which are not connected to the sense amplifier blocks.

The isolation transistors ITR11 and /ITR11, ITR12 and /ITRI2 . . . , ITR43 and /ITR43 connect or disconnect the sense amplifier circuits SA11, SA12, SA21, SA31, and SA32 to or from corresponding bit lines BL and inverted bit lines /BL.

The sense amplifier circuits SA11, SA12, SA21, SA31, and SA32 included in the sense amplifier blocks SAB1, SAB2, and SAB3 are folded-type sense amplifier circuits. That is, bit lines BL and inverted bit lines /BL of the same memory cell blocks are connected to the sense amplifier circuits of the same sense amplifier blocks. The connected bit lines BL and the connected inverted bit lines /BL are positioned on one of different adjacent memory cell blocks MCB1, MCB2, MCB3, and MCB4.

For example, a bit line BL and an inverted bit line /BL of the memory cell block MCB1 are connected the folded-type sense amplifier circuit SA11 by the isolation transistors ITR11 and /ITR11.

Also, a bit line BL and an inverted bit line /BL of the memory cell block MCB2 are connected to the sense amplifier circuit SA11 of the sense amplifier block SAB1 by the isolation transistors ITR21 and /ITR21.

Likewise, a bit line BL and an inverted bit line /BL of the memory cell block MCB3 are connected to the folded-type sense amplifier circuit SA32 by the isolation transistors ITR33 and /ITR33.

Also, a bit line BL and an inverted bit line /BL of the memory cell block MCB4 are connected to the sense amplifier circuit SA32 of the sense amplifier block SAB3 by the isolation transistors ITR43 and /ITR43.

If the bit line BL and inverted bit line /BL of the memory cell block MCB1 are connected to the sense amplifier circuit SA11 of the sense amplifier block SAB1 by the isolation transistors ITR11 and /ITR11, the isolation transistors ITR21 and /ITR21 of the memory cell block MCB2 are turned off, so that the bit line BL and inverted bit line /BL of the memory cell block MCB2 are disconnected from the sense amplifier circuit SA11.

That is, When the semiconductor memory device 600 operates normally, if a bit line and an inverted bit line positioned on a first side of a sense amplifier circuit are connected to the first side of a sense amplifier circuit, a bit line and an inverted bit line positioned on a second side of the sense amplifier circuit are disconnected from the sense amplifier circuit by isolation transistors.

The bit line BL and the inverted bit line /BL of the memory cell block MCB2 connected to the sense amplifier circuit SA11 are disconnected from the bit line BL and the inverted bit line /BL of the memory cell block MCB3 connected to the sense amplifier circuit SA31.

Also, the bit line BL and the inverted bit line BL of the memory cell block MCB2 connected to the sense amplifier circuit SA21 are disconnected from the bit line BL and the inverted bit line /BL of the memory cell block MCB3 connected to the sense amplifier circuit SA32.

Likewise, the bit line BL and the inverted bit line /BL of the memory cell block MCB2 connected to the sense amplifier circuit SA21 are disconnected from the corresponding bit line BL and inverted bit line /BL of the memory cell block MCB1.

In the semiconductor memory device 600 illustrated in FIG. 6, isolated bit lines BL are connected to each other and also isolated inverted bit lines /BL are connected to each other, using the switches SW1 and SW2.

For example, the switches SW1 respectively connect the bit line BL and inverted bit line /BL of the memory cell block MCB2 connected to the sense amplifier circuit SA11, to the bit line BL and inverted bit line /BL of the memory cell block MCB3 connected to the sense amplifier circuit SA31, in response to the shift signal SFT1.

Also, the switches SW1 respectively connect the bit line BL and inverted bit line /BL of the memory cell block MCB2 connected to the sense amplifier circuit SA12, to the bit line BL and inverted bit line /BL of the memory cell block MCB3 connected to the sense amplifier circuit SA32, in response to the shift signal SFT1.

Likewise, the switches SW1 respectively connect the bit line BL and inverted bit line /BL of the memory cell block MCB2 connected to the sense amplifier circuit SA21, to the corresponding bit line BL and inverted bit line /BL of the memory cell block MCB1.

The switches SW2 respectively connect the bit line BL and inverted bit line /BL of the memory cell block MCB3 connected to the sense amplifier circuit SA21, to the corresponding bit line BL and inverted bit line /BL of the memory cell block MCB4.

In this manner, the switches SW1 and SW2 respectively connect isolated bit lines BL to each other and respectively connect isolated inverted bit lines /BL to each other, between adjacent memory cell blocks.

The switches SW1 and SW2 may be NMOS transistors or PMOS transistors whose gates receive the shift signals SFT1 and SFT2. In FIG. 6, the switches SW1 and SW2 are NMOS transistors.

Alternately, the switches SW1 and SW2 may be transmission gates which are turned on or off in response to the shift signals SFT1 and SFT2. The shift signals SFT1 and SFT2 are activated so as to shift data connected to an arbitrary word line WL1 to memory cells connected to another arbitrary word line WL2. The shift signals SFT1 and SFT2 can be generated by a MRS.

Hereinafter, the semiconductor memory device 600 and a data shifting method 700 thereof will be described in more detail with reference to FIGS. 6 and 7.

Referring to FIGS. 6 and 7, a predetermined word line WL1 of an arbitrary first memory cell block MCB1 is enabled (operation 710). Data stored in memory cells (not shown) connected to the word line WL1 is data to be shifted.

Then, isolation transistors are turned on, thus respectively connecting sense amplifier circuits to corresponding bit lines (operation 720). When the semiconductor memory device 600 operates normally, only isolation transistors positioned on one side of a sense amplifier circuit are turned on. However, when an operation of shifting data of an arbitrary word line WL1 is performed, isolation transistors connected to both sides of the sense amplifier circuit are all turned on.

That is, the isolation transistors ITR11 and /ITR11, and ITR21 and /ITR21 positioned on both sides of the sense amplifier circuit SA11 are respectively turned on in response to control signals S1 and S2. Also, the isolation transistors ITR13 and /ITR13, and ITR23 and /ITR23 positioned on both sides of the sense amplifier circuit SA12 are respectively turned on in response to the control signals S1 and S2.

Likewise, the isolation transistors ITR22 and /ITR22, ITR32 and /ITR32, ITR31 and /ITR31, ITR33 and /ITR33, ITR41 and /ITR41, and ITR43 and /ITR43 respectively positioned on both sides of the sense amplifier circuits SA21, SA31, and SA32 are respectively turned on in response to control signals S3 and S4.

Bit lines connected to the word line WL1 are connected to corresponding bit lines of second through n-th memory cell blocks adjacent to the first memory cell block MCB1 (operation 730). Here, n represents a target memory cell block to which data connected to the word line WL1 will be shifted. In FIG. 6, n is 4 because data connected to the word line WL1 is shifted to the fourth memory cell block MCB4. However, it will be appreciated by one of ordinary skill in the art that the invention is not limited to the case where n is 4.

The bit lines are connected to each other by the switches SW1 and SW2 which are turned on or off in response to shift signals SFT1 and SFT2. In order to shift data connected to the word line WL1 of the first memory cell block MCB1 to the word line WL2 of the fourth memory cell block MCB4, the switches SW1 and SW2 disposed between the first memory cell block MCB1 and the fourth memory cell block MCB4 are turned on.

The sense amplifier circuits SA11, SA12, SA21, SA31, and SA32 of the sense amplifier blocks SAB1, SAB2, and SAB3 respectively disposed between the first through fourth memory cell blocks MCB1 through MCB4, are activated so as to shift data stored in memory cells connected to the word line WL1 to bit lines of the fourth memory cell block MCB4 (operation 740).

First, if the sense amplifier circuits SA11 and SA12 of the sense amplifier blocks SAB1 are activated, data is shifted to the sense amplifier circuits SA11 and SA12 via bit lines BL and inverted bit lines /BL. Then, sequentially, the sense amplifier circuits SA21, SA31, and SA32 of the sense amplifier blocks SAB2 and SAB3 are activated.

Then, since the isolation transistors ITR21, /ITR21, ITR23, and /ITR23 connected to the sense amplifier circuits SA11 and SAl2 and the switches SW1 disposed in the sense amplifier block SAB1 are turned on, the data is shifted to the bit lines BL and inverted bit lines /BL of the fourth memory cell block MCB4 via the switches SW1 of the sense amplifier block SAB2 and the sense amplifier circuit SA21.

Then, the word line WL2 of the fourth memory cell block MCB4 is enabled so that the data is stored in memory cells connected to the word line WL2 of the fourth memory cell block MCB4 (operation 750). That is, when the word line WL2 is enabled, the data transferred to the bit lines BL and inverted bit lines /BL of the fourth memory cell block MCB4 is stored in memory cells connected to the word line WL2.

The semiconductor memory device 600 including the folded-type sense amplifier circuits as illustrated in FIG. 6 can easily shift data stored in memory cells connected to an arbitrary word line WL1, to memory cells connected to a desired word line WL2 using the data shift method described above. In the current embodiment of the present invention, the memory cell blocks MCB1 through MCB4 illustrated in FIG. 6 may be disposed in the same memory bank.

As described above, in a semiconductor memory device and a data shift method thereof according to the present invention, it is possible to easily shift data stored in memory cells connected to an arbitrary word line to memory cells connected to another arbitrary word line.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
a plurality of memory cell blocks each comprising a plurality of bit lines and a plurality of word lines;
a plurality of sense amplifier blocks respectively disposed between the memory cell blocks, wherein each sense amplifier block comprises a plurality of sense amplifier circuits corresponding to the bit lines; and
switches connecting bit lines not sharing a sense amplifier block among bit lines of adjacent memory cell blocks between which the sense amplifier block is disposed in response to a shift signal, and not connecting bit lines sharing a sense amplifier block.

2. The semiconductor memory device of claim 1, wherein the switches are NMOS transistors or PMOS transistors whose gates receive the shift signal.

3. The semiconductor memory device of claim 1, wherein the switches are transmission gates which are turned on or off in response to the shift signal.

4. The semiconductor memory device of claim 1, wherein the shift signal is generated by a Mode Register Set (MRS).

5. The semiconductor memory device of claim 1, wherein the sense amplifier circuits are open-type sense amplifier circuits to which a bit line of a first memory cell block and an inverted bit line of a second memory cell block adjacent to the first memory cell block are connected.

6. A semiconductor memory device comprising:
a plurality of memory cell blocks each comprising a plurality of bit lines and a plurality of word lines;
a plurality of sense amplifier blocks respectively disposed between the memory cell blocks, wherein each sense amplifier block comprises a plurality of sense amplifier circuits corresponding to the bit lines;
switches connecting bit lines not sharing a sense amplifier block among bit lines of adjacent memory cell blocks between which the sense amplifier block is disposed in response to a shift signal, and not connecting bit lines sharing a sense amplifier block; and
isolation transistors connecting or disconnecting bit lines to or from corresponding sense amplifier circuits.

7. The semiconductor memory device of claim 6, wherein the switches are NMOS transistors or PMOS transistors whose gates receive the shift signal.

8. The semiconductor memory device of claim 6, wherein the switches are transmission gates which are turned on or off in response to the shift signal.

9. The semiconductor memory device of claim 6, wherein the shift signal is generated by a Mode Register Set (MRS).

10. The semiconductor memory device of claim 6, wherein the sense amplifier circuits are folded-type sense amplifier circuits, wherein a bit line and an inverted bit line connected to the same sense amplifier circuit by the isolation transistor are disposed on one of the memory cell blocks adjacent to the memory cell block including the same sense amplifier circuit.

* * * * *

UNITED STATES PATENT AND TRADEMARK OFFICE
CERTIFICATE OF CORRECTION

PATENT NO. : 7,457,188 B2  Page 1 of 1
APPLICATION NO. : 11/457050
DATED : November 25, 2008
INVENTOR(S) : Dong-Hyuk Lee It is certified that error appears in the above-identified patent and that said Letters Patent is hereby corrected as shown below:

Column 2, line 66, the word "SA1l" should read -- SA1 --;
Column 5, line 6, the word "SWI" should read -- SW1 --;
Column 6, line 47, the word "ITR2" should read -- ITR12 --;
Column 6, line 55, the word "/ITR12" should read -- /ITR12, --;
Column 7, line 26, the word "When" should read -- when --;
Column 9, line 14, the word "SAI2" should read -- SA12 --.

Signed and Sealed this

Twenty-fourth Day of March, 2009

JOHN DOLL
*Acting Director of the United States Patent and Trademark Office*